United States Patent
Paul et al.

(10) Patent No.: US 10,128,755 B2
(45) Date of Patent: Nov. 13, 2018

(54) SLEW MODE CONTROL OF TRANSIENT PHASE BASED ON OUTPUT VOLTAGE SLOPE OF MULTIPHASE DC-DC POWER CONVERTER

(71) Applicant: Apple Inc., Cupertino, CA (US)

(72) Inventors: Rajarshi Paul, Los Gatos, CA (US); Parin Patel, San Francisco, CA (US); Damon Lee, San Jose, CA (US); Evaldo Miranda, Jr., Saratoga, CA (US); Mark A. Yoshimoto, San Jose, CA (US); Jamie L. Langlinais, San Francisco, CA (US); Jonathan M. Audy, Monte Sereno, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/627,082

(22) Filed: Jun. 19, 2017

(65) Prior Publication Data

US 2018/0013348 A1    Jan. 11, 2018

Related U.S. Application Data

(63) Continuation-in-part of application No. 15/419,259, filed on Jan. 30, 2017.

(Continued)

(51) Int. Cl.
    *H02M 1/14*    (2006.01)
    *H02M 3/158*    (2006.01)
(Continued)

(52) U.S. Cl.
    CPC ........... *H02M 3/158* (2013.01); *H02M 1/083* (2013.01); *H02M 1/14* (2013.01); *H02M 3/157* (2013.01);

(Continued)

(58) Field of Classification Search
    CPC ......... H02M 2001/0009; H02M 1/084; H02M 1/14; H02M 3/158
    See application file for complete search history.

(56) References Cited

U.S. PATENT DOCUMENTS 6,912,144 B1 * 6/2005 Clavette .............. H02M 3/1584
                                                         323/283
8,243,410 B2    8/2012 Ayyanar et al.
(Continued)

OTHER PUBLICATIONS

Barrado, A., et al., "Fast transient response DC/DC converter for low output voltage", *Electronics Letters*, vol. 38, No. 19, (Sep. 12, 2002), 1127-1128.

(Continued)

*Primary Examiner* — Jeffrey Gblende
*Assistant Examiner* — David A. Singh
(74) *Attorney, Agent, or Firm* — Blank Rome LLP

(57) ABSTRACT

A multi-phase switch mode, voltage regulator has a transient mode portion in which a phase control output is coupled to one or more control inputs of one or more switch circuits that conduct inductor current through one or more transient phase inductors, from amongst a number of phase inductors. A slew mode control circuit detects a high slope and then a low slope in the feedback voltage and, in between detection of the high slope and the low slope, pulses the phase control output of the transient mode portion so that the switch circuit that conducts transient phase inductor current adds power to, or sinks power from, the power supply output. Other embodiments are also described.

27 Claims, 9 Drawing Sheets

Related U.S. Application Data

(60) Provisional application No. 62/360,858, filed on Jul. 11, 2016.

(51) Int. Cl.
    *H03K 5/04*     (2006.01)
    *H02M 1/08*     (2006.01)
    *H02M 3/157*     (2006.01)
    *H02M 1/00*     (2006.01)

(52) U.S. Cl.
    CPC ....... *H03K 5/04* (2013.01); *H02M 2001/0009* (2013.01)

(56) References Cited

U.S. PATENT DOCUMENTS

| | | | |
|---|---|---|---|
| 9,397,567 B2 | 7/2016 | Searles | |
| RE46,419 E * | 5/2017 | Isham | |
| 2002/0180410 A1* | 12/2002 | Brooks | H02M 3/156 323/282 |
| 2014/0015500 A1* | 1/2014 | Babazadeh | H02M 3/1584 323/272 |
| 2014/0210266 A1* | 7/2014 | Tournatory | H02M 3/158 307/31 |

OTHER PUBLICATIONS

Barrado, A., et al., "New DC/DC Converter With Low Output Voltage and Fast Transient Response", *IEEE* (2003), 432-437.

\* cited by examiner

SLEW MODE CONTROL OF TRANSIENT PHASE BASED ON OUTPUT VOLTAGE SLOPE OF MULTIPHASE DC-DC POWER CONVERTER

This application is a Continuation-in-Part of co-pending U.S. application Ser. No. 15/419,259, filed Jan. 30, 2017, which claims the benefit of the earlier filing date of U.S. Provisional Patent Application No. 62/360,858, filed Jul. 11, 2016.

FIELD

An embodiment of the invention relates to switch mode multi-phase dc-dc voltage regulator circuits used in portable consumer electronic devices. Other embodiments are also described.

BACKGROUND

Output voltage regulation and maintaining the accuracy of the regulated voltage provided by a switch mode power converter can be a very demanding task. In the field of multi-function portable consumer electronic devices (also referred to here as mobile devices, such as smartphones, tablet computers, and laptop computers) the power requirements of the constituent components such as the display screen, the wireless communications interface, the audio subsystem, and the system on a chip (SoC) or applications processor are quite demanding. For example, in such devices, the load on an output node of a voltage regulator can exhibit sudden changes that are so great, e.g. as fast as 100 Amperes-1000 Amperes per microsecond, that the output node exhibits transient voltage droop. Attempts at reducing the transient voltage droop by the conventional approach of simply using larger load capacitance and higher performance decoupling and/or filter capacitors may not be practical in many instances.

Another solution to achieve fast transient recovery that has been suggested is a transient recovery circuit that responds only to fast changes in the load, so as to suppress both output voltage overshoot and undershoot (droop). The transient recovery circuit may operate independently of a regular feedback circuit that controls the phases of a multi-phase switching regulator more "slowly", during steady state operation (when the load is not changing rapidly). The transient recovery circuit overrides a control voltage from the regular feedback circuit so as to control the duty cycle of a pulse width modulation circuit in the switching regulator, only during transient conditions. The transient recovery circuit may also control a dedicated phase, of a multi-phase switching regulator, and may remain inactive during non-transient conditions.

SUMMARY

An embodiment of the invention is a method for dc-dc power conversion that uses a multi-phase switch mode power supply circuit that has at least two controller portions, one of which is referred to here as a transient mode portion. The phases include one or more transient phases that are controlled by the transient mode portion, where the transient phases are controlled so that they do not transfer power to the power supply output during a steady state load condition. The transient mode portion has a slew mode control circuit that detects a high slope and then a low slope in a feedback voltage from the power supply output. Between the times the high slope and low slope are detected, a switch circuit of the transient phase is pulsed so as to deliver a controlled amount of power to the power supply output (which reduces the voltage droop that would otherwise have occurred during a step load transient condition). The pulsing of the switch circuit may be controlled by a current limiter blocker or by an on-time blocker. The transient phase inductor current thus rises to an upper level and then falls to a lower level (as determined by the particular blocker being used), and then repeats, until the low slope is detected at which point the switch circuit is turned off while allowing the inductor current to circulate and fall to zero. If no further high slope is then detected, then the transient phase is disabled (e.g., both the high side and the low side switches of the switch circuit are turned off) once the inductor current in the transient phase has reached zero. Because the transient phase is operated in this manner only during transient conditions, the switching loss that takes place in the switching transistors of the transient phase can be tolerated, even in an embodiment where the transient phase has the smallest inductor amongst all of the phases (e.g. at least 100 times smaller than the largest inductor in the other phases) and its switching frequency may be significantly greater than that of the other phases. Simulations show that adding the transient mode portion results in significant reductions in droop.

Another embodiment may be to enter the transient phase switching regime (also referred to here as slew mode control of the transient phases) only when the output voltage has dropped significantly (as detected by a voltage comparator against a predetermined voltage threshold, Vunder) and together with the earlier mentioned voltage slope detector. In other words, the transient phase switching is initially enabled only if i) the output voltage has dropped a certain amount (e.g., below a predetermined absolute voltage threshold) and ii) the high slope is detected. The Vunder detection may also be used after the initial triggering of transient phase switching, so that the transient phase is not turned ON each time the high slope is detected unless the output voltage is also detected to be below Vunder. Such a scheme may prevent triggering of the transient phase switching at light load operations.

A similar benefit is also expected when the transient mode portion is configured to mitigate an overshoot, by pulsing the transient phase to obtain a controlled sink of power from the power supply output (which reduces the voltage overshoot that would otherwise have occurred during a step load transient condition).

In one aspect, a step-down, DC-DC switch mode power converter is divided into two portions, a steady state mode portion which serves to provide primarily the steady state or slow varying portion of the load current, e.g., the maximum rated DC load current can be sourced by the steady state phases, and a transient mode portion which is only enabled when the power supply output is in a transient condition (it is disabled when the power supply output is in a steady state condition). The transient mode portion may have a slew mode control circuit control the transient phase, independent of the steady state portion but responding to the same feedback voltage.

In a current limiter blocker embodiment, the transient phase's pulse width is controlled on a per-cycle (repeating) basis, based on sensing the inductor current through the transient phase and comparing the sensed current to an inductor current limit or threshold, which threshold is defined by at least two programmable values. These programmable values result in the inductor current limit being selected to be high when a detected, feedback voltage change is large (e.g., large droop, or large overshoot), and low when the detected feedback voltage change is small. Also, the off-time (the time interval during which the switch circuit is turned OFF and the inductor current is allowed to circulate and fall) should be long enough to restrict runaway of the inductor current. It may be made programmable based on a look-up table that lists different combinations of input voltage and output voltage states.

In an on-time blocker embodiment, the transient phase's pulse width is set to a predetermined time interval, without relying on sensing the inductor current. This is referred to here as on-time (the interval during which the switch circuit is turned ON), and is selected to be long when the output voltage change is large, short when the output voltage change is small. This approach is preferred vs. the current limiter blocker, when the transient phase inductor is relatively small (e.g., 10 nH and smaller), because the inductor current in that case rises/falls too quickly for the reaction time of the current limiter blocker circuitry. The off-time here should be long enough to allow the inductor current to fall enough so that the next time the phase is turned ON, there is a desired time interval over which the inductor current then ramps back up to its upper level and also to restrict inductor current run-away.

The transient phase switch circuit or power-stage may be synchronous (with both a high-side transistor switch and low-side transistor switch) or it may be asynchronous with the low-side transistor replaced or augmented with a free-wheeling diode in which case the slew mode controller may just need to control the high side switch.

The supply (power supply input) of the transient phase may be the same or different from that of the steady-state phase. A separate lower supply voltage may be used for the transient phase to enable the use of faster and smaller transistors whose fabrication process technology may allow them to be implemented directly in the same fabrication process as the load itself.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness and reducing the total number of figures, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever the shapes, relative positions and other aspects of the parts described in the embodiments are not explicitly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
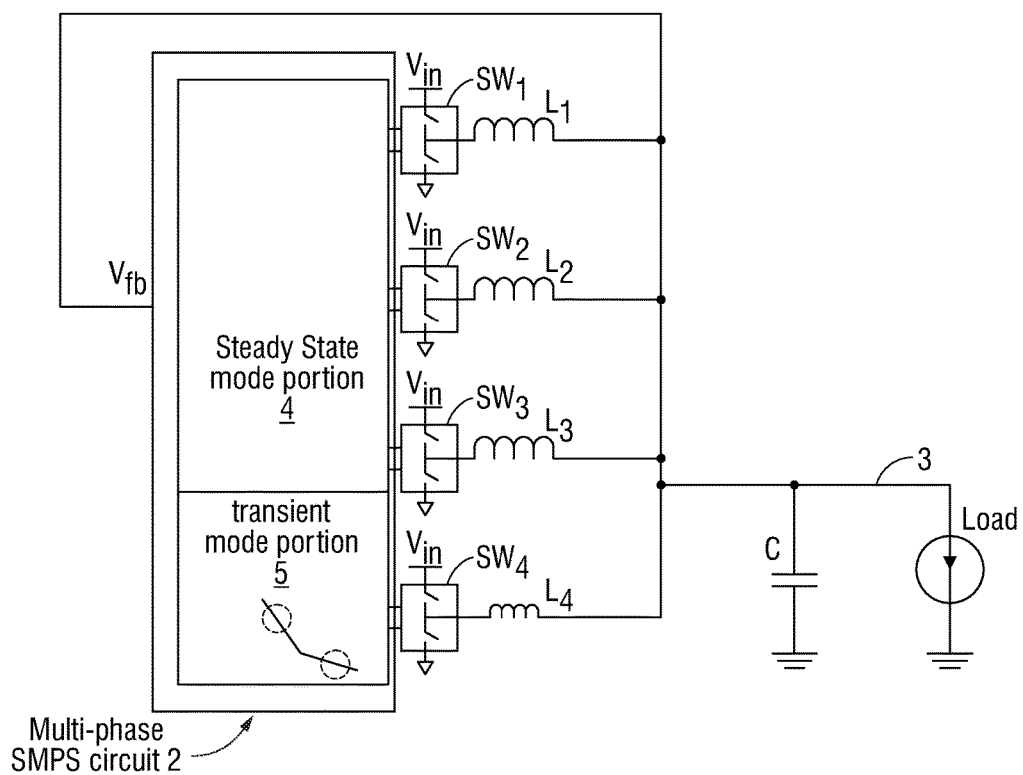
FIG. 1 is a combined block diagram and circuit schematic illustrating an example switch mode power supply circuit supplying power to a load.

FIG. 1 is a combined block diagram and circuit schematic illustrating an example, multi-phase switch mode power supply (SMPS) circuit 2 supplying power to a load. The multi-phase SMPS circuit 2 is for controlling the transfer of power to a power supply output 3, to which a filter capacitor 3 and the load are coupled as shown, through a number of phases having phase inductors L1, L2, . . . respectively, where in this example four phases are shown coupled in parallel between a power supply voltage input Vin and the output 3. Note that the Li label is used here as referring to not just an inductor but also the phase, which the inductor and a respective switch circuit SWi are a part. The multi-phase SMPS circuit 2 may serve to regulate voltage at the output 3, for example as a buck converter that steps down from a higher voltage power supply input, Vin, to a lower voltage at the output 3. Just as an example, Vin may be a battery voltage provided for example by a rechargeable battery (e.g., having lithium based chemistry that produces a nominal battery voltage of 3.7 Volts), while the voltage at the output 3 may be 1 Volt dc. In the case where the multi-phase SMPS circuit 2 is implemented as part of a portable consumer electronics device (e.g., a smart phone, a tablet computer, a laptop computer), in which the only source of power is a rechargeable battery, the constituent circuit components of the SMPS circuit 2 such, described below, may also be powered by the same Vin (or battery voltage).

In one embodiment, the SMPS circuit 2 has a steady state mode portion 4 and a transient mode portion 5. The steady state mode portion 4 has one or more phase control outputs that are coupled to one or more control inputs of one or more switch circuits, respectively, that conduct inductor current through one or more steady state phase inductors. In this example, there are a total of four phases where each phase Li has a respective inductor, of which phases L1, L2, and L3 are steady state phases, while L4 is a transient phase. The steady state mode portion 4 has a low frequency or slow control loop (referred to here as having a dc gain) that regulates the voltage on the output 3, based on a feedback voltage Vfb, by operating the steady state phases and not the transient phases. The steady state mode portion 4 may implement any suitable power controller algorithm for controlling the steady state phases, such as voltage mode, current mode, hysteretic or on/off time controllers, and may be optimized for static efficiency at light and large load, dc regulation, line transients and electro-magnetic interference compliance. The concepts here are more generally applicable to one or more other phases and one or more transient phases, as the number of transient and other phases may be different than illustrated in the figures.

The inductor current in each phase is conducted through its respective switch circuit SWi, which in this example includes a high side solid state switch (e.g., a switching transistor) and a low side solid state switch, where the high side switch is tied to the power supply input Vin, while the low side switch is tied to the circuit or system ground. In this case, each switch circuit SWi has two control inputs, one for the high side switch and one for the low side switch. An alternative to having both a high side and a low side switch is to simply use the body diode of a transistor that is kept turned OFF, or to replace the low side transistor with a stand alone diode, in both cases resulting in only one control input for the switch circuit SWi. Also, if desired, one or more of the phases may have its switch circuit SWi coupled to a different power supply input voltage. For example, in the case of the portable consumer electronics device, the steady state phases L1-L3 may be coupled to the battery voltage, while the transient phase L4 is coupled to a lower power supply voltage, for example through the use of an additional power converter (e.g., another buck converter or a capacitor divider from the battery) that steps down the 3.7 Volts battery voltage to just 1 Volt or any voltage that is lower than the battery which is required to provide the necessary regulated output voltage at the load. One clear benefit of having the supply for the transient phase connected to a supply other than the battery is to prevent the transient phase from demanding fast, transient spikes of current directly from the battery. This may be desirable if the constituent transistors of the SW4 switch circuit, in phase L4, are composed of smaller transistors that have a lower voltage rating than the devices that form the switch circuits of the steady state phases L1-L3. Such smaller or lower voltage transistors offer lower switching losses and/or higher switching speeds, which are beneficial at high switching frequencies (e.g., above 30 MHz) which may be needed to control a transient phase inductor having an inductance of 10 nH or less. In one embodiment, the smaller or lower voltage transistors are fabricated using the same microelectronic fabrication process that is used for making the larger transistors that form the switches of the steady state phases.

Figure 9:
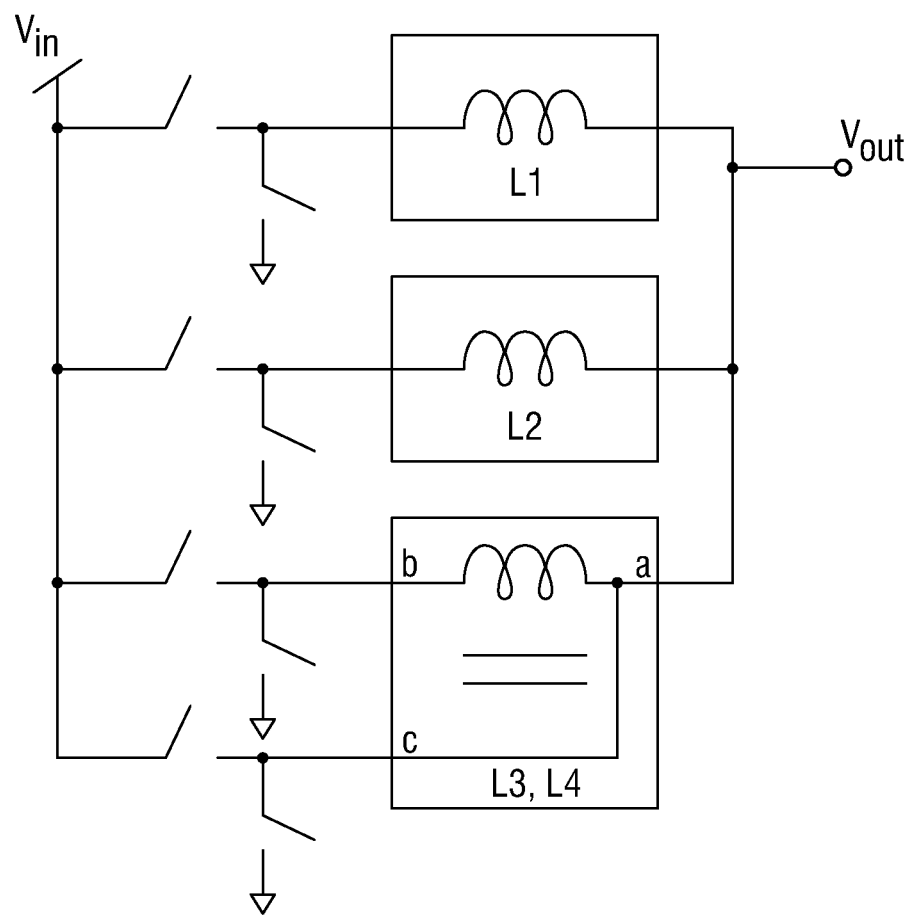
FIG. 9 is a circuit schematic illustrating the 4 phases of FIG. 1 in an embodiment where the transient phase inductor L4 is a coupled inductor co-packaged with inductor L3.

As explained below, the inductor of the transient phase L4 may have much smaller inductance than every one of the inductors of the steady state phases L1-L3, so as to better support the role of the transient phase L4 in providing the rapid power boost (or sink) needed for a power converter to recover more quickly from a transient load. As an example, each of the one or more transient phase inductors (here, just L4) may have at least 10 times smaller inductance than every one of the steady state phase inductors (here, L1-L3). As another example, each of the one or more transient phase inductors may have at least 100 times smaller inductance than the steady state phase inductor that has the largest inductance. An example of the latter combination may be L1=1 microHenry, L2=0.47 microHenry, L3=0.1 microHenry, and L4=0.01 microHenry (although it is not necessary that all of the other phases, L1-L3 have different inductance values). The transient phase inductance may be so small that it could be implemented as a single wire segment or partial loop (no multiple winding or coil like structure as in a discrete inductor). That wire segment or partial loop directly connects the power supply to its transient phase switching transistor (so that there is no discrete inductor in the transient phase). The inductance of the wire segment or partial loop may be increased, by designing for some magnetic coupling with a nearby discrete inductor of a steady state phase (also referred to as a coupled inductor). As seen in FIG. 9 for example, the transient phase inductor (here, L4) may be the result of a coupled inductor design or a stray/parasitic effect, where there is magnetic coupling between a winding and a separate partial loop of wire: this produces the inductance of the steady state phase inductor L3 at terminals a, b, and the inductance of the transient phase inductor L4 at terminals a, c in the same passive component package.

Inductance levels of 0.01 microHenry and less are so small that a typical buck converter design for using them as the steady state phase inductors may need switching transistors that need be operated on the order of 100 MHz switching frequency. If used for steady state operation, such small inductors may also require switching transistors whose switching losses are relatively small, in order to limit the total switching loss of the converter to a reasonable level. That means small, low voltage transistors are needed. These however cannot be operated at 3.7 Volts (the typical lithium based rechargeable battery voltage in a portable consumer electronic device), and so an additional regulator is needed to produce the lower, input supply voltage.

In accordance with an embodiment of the invention, the transistor switching losses associated with such a small inductor is tolerable, even when the inductor is used in a transient phase that may have the same specification for its switching transistors as the ones used for the steady state phases, which can withstand full battery voltage. The switching losses are kept to a low enough level, because of the relatively short amount of time that the transient phase is enabled. Using larger transistors that can operate at full battery voltage also avoids the need for a separate step down regulator. A further benefit is reduced expense when all of the switching transistors, for all of the phases, are formed in the same monolithic integrated circuit as the steady state and transient mode portions 4, 5. Further, in the embodiments where the transient phase is not turned ON unless, in addition to the high slope, an absolute output voltage threshold is also detected, which will henceforth be called Vunder (for undershoot of voltage below a threshold) and Vover (for overshoot of voltage above a threshold), then transient phase operation is restricted to situations that are only within a bandpass detection of the output voltage slope. This may reduce power loss at light load operation.

The transient mode portion 5 has an input to receive the feedback voltage Vfb from the power supply output 3. The feedback voltage may be obtained through a low impedance path directly from the power supply output 3, or it may be a conditioned, filtered or other derived form of the voltage on the power supply output 3. A slew mode control circuit (not shown in FIG. 1 but described below using examples in FIG. 4 and FIG. 6) is configured to detect a high slope and then a low slope in the feedback voltage, and in response operate the switch circuit of the transient phase inductor L4 (through the phase control output). In FIG. 1, there are two, phase control outputs shown for each phase, because of the type of control needed in the case where the switch circuit SWi is composed of both a high side and a low side switch. When the switch circuit SWi has only a high side switch and a diode tied to ground, a single, phase control output for each phase is sufficient.

Figure 2:
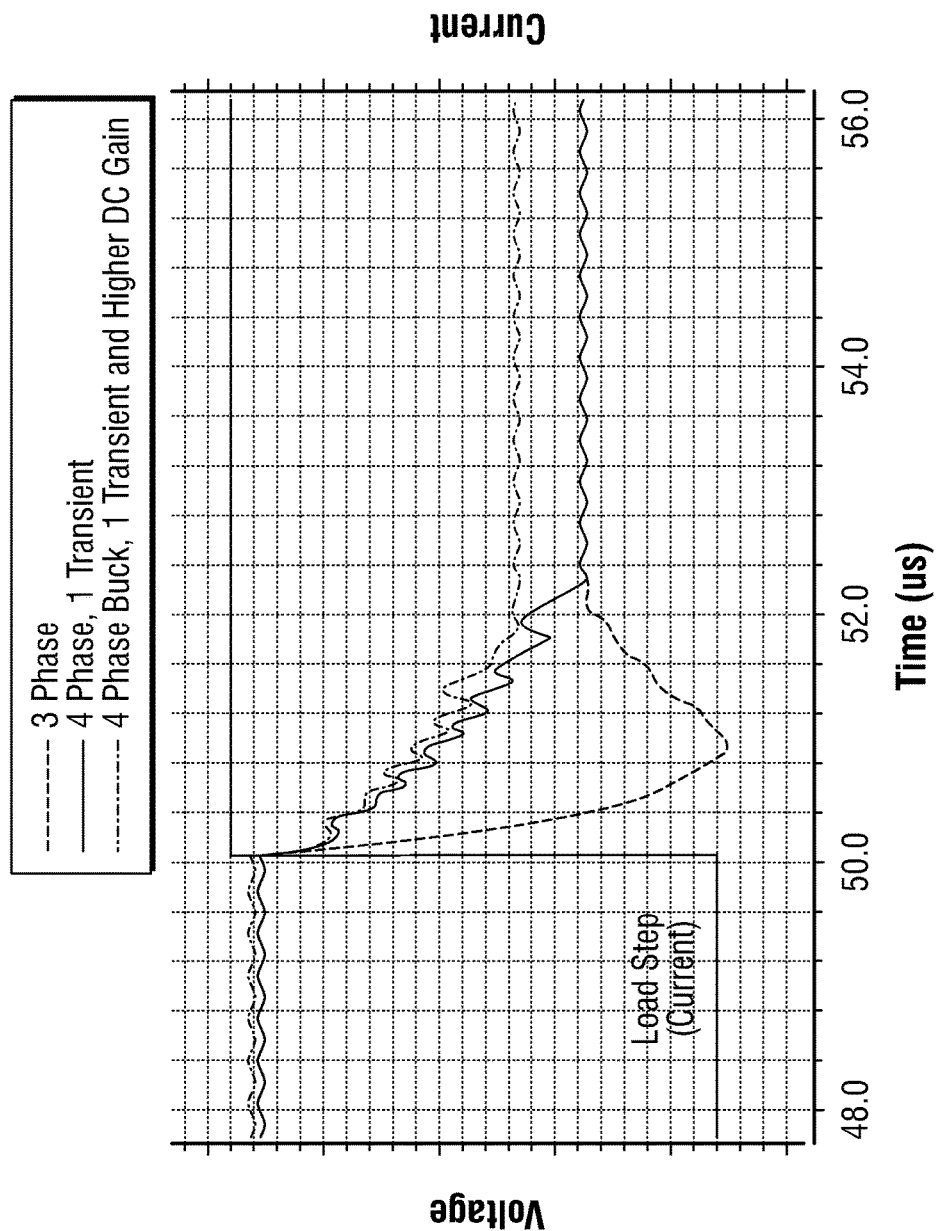
FIG. 2 is a graph of several waveforms illustrating droop improvement.

The embodiments of the invention described here have shown reductions in the droop exhibited by the voltage on the output 3 during load transients, as for example depicted in the graph of FIG. 2. The stimulus here is a load step (current) that increases abruptly at time marker 50, causing a droop of over 100 millivolts in the case of a regulated output voltage of 1 Volt. It can be seen that with the addition of the transient mode portion 5 including the particular slew mode control circuit described below, operating upon an additional phase L4, the droop can be reduced between 43% and 75%, e.g., 30 millivolts in one instance, and even further by almost 50 millivolts (if a higher dc gain is programmed into the steady state mode portion 4—see FIG. 1). The relative improvements show here are as compared to the case where only 3 phases are operating (as controlled by the steady state portion 4). Note that the steady state portion 4 may be configured to implement any suitable switch mode power supply controller topology, for example a multi-phase synchronous buck converter topology which may also use the feedback voltage Vfb in implementing a voltage regulation control loop to regulate the dc output voltage of the power supply output 3.

In other words, the simulation results in FIG. 2 show that if a fast responding transient phase is added and is allowed to operate only during intervals between a high slow and a subsequent low slope in the voltage at the output 3, then a faster dc regulation loop may be designed into the steady state mode portion 4, resulting in a smaller voltage drop during the high load condition. Such a solution may also allow a reduction of the capacitance area in the filter capacitor C (see FIG. 1), where it is understood that the filter capacitor C may serve to improve dc stability of the steady state mode portion while filtering out the voltage ripple that is produced by a switch mode power supply. Viewed another way, the transient mode portion 5 along with the addition of the transient phase L4 is enabled only until dc regulation of the output 3 is achieved by the steady state mode portion 4.

Figure 3:
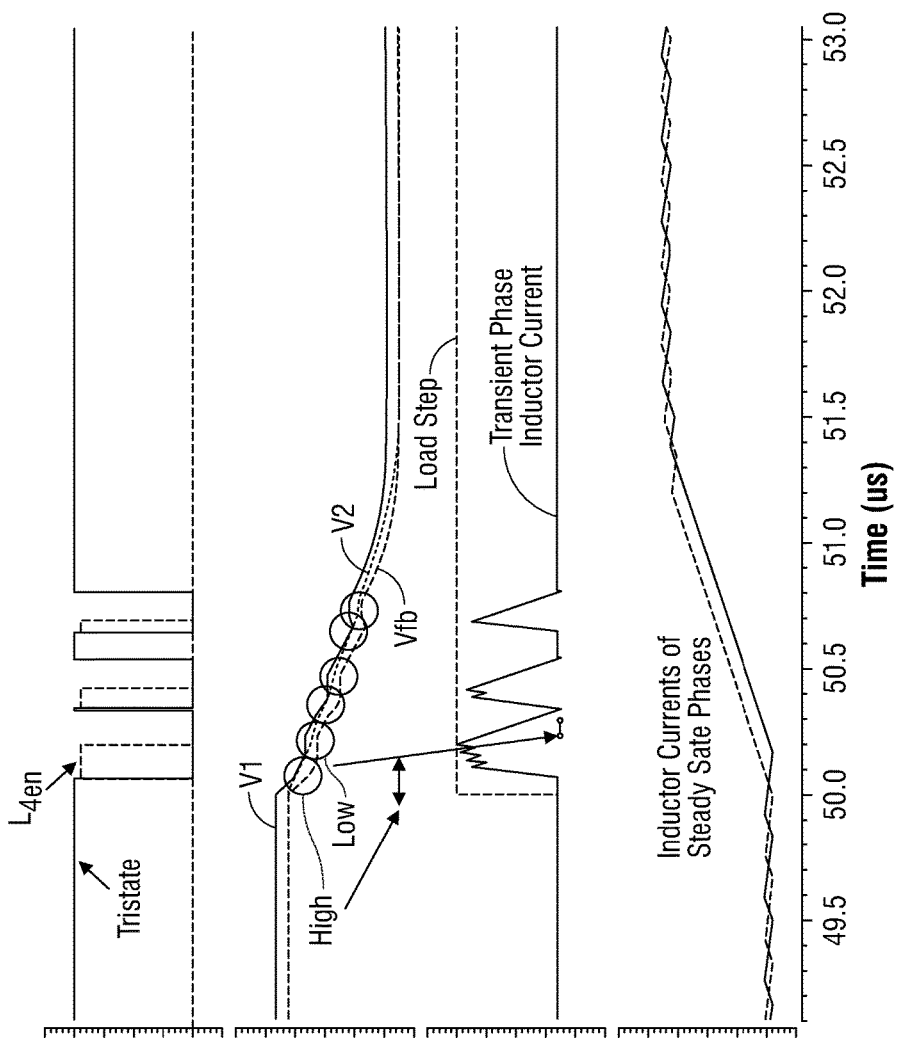
FIG. 3 is a graph of waveforms representing transient phase and other phase inductor currents during a transient load condition, and waveforms of several constituent voltage signals and control signals of a multi-phase switch mode power supply circuit having a transient mode portion controlling a transient phase, and another portion controlling other phases.

Referring now to FIG. 3, relevant waveforms produced by a simulation of the system in FIG. 1 are shown. There are four rows of waveforms shown. The first row shows two digital or bistable control signals that, as described further below, may be used to produce the phase control output which in turn may directly control the switch circuit SW4 of the transient phase. The second row of waveforms illustrates the behavior of the feedback voltage Vfb. The third row shows the particular load step that is being used in this simulation, and the behavior of the transient phase inductor current. Finally, the fourth row contains the waveforms of inductor current in two of the steady state phases, respectively.

Beginning with prior to the time marker 50, the feedback voltage is essentially at a dc level dictated by the regulated output voltage. There are two, phase control outputs produced by the transient mode portion in this case, namely tristate and L4pwm—see FIG. 1. The L4pwm is derived from an intermediate control signal L4en depicted in FIG. 3. The tristate signal is in its asserted state, which means that the transient phase is disabled (its high side and low side switches are turned OFF, and the inductor current through the transient phase is zero). The other control signal L4en, prior to time marker 50, is de-asserted, which means that L4pwm is not being pulsed.

Next, at time marker 50, a load step is applied and in response the voltage on the output 3 drops as shown in the second row of waveforms. As highlighted by the small circles, and in particular the first circle, the feedback voltage drops fast enough such that its slope is detected to be a high slope, in response to which tristate is de-asserted and L4en is asserted. This means that the phase control output is now asserted so as to turn ON the switch circuit SW4 of the transient phase, resulting in a rapid increase in the transient phase inductor current as shown. Note how at this point, the inductor currents of the steady state phases have hardly begun increasing, consistent with the "slow" response of the steady state mode portion. Here it should be noted that because the transient phase inductor L4 is relatively small (low inductance) its inductor current will increase rapidly and needs to be controlled so as not to short circuit the power supply input Vin. In one embodiment, the rising inductor current is reversed and begins to fall, when a predefined current limit is reached. This is also referred to as the current limit blocker version, which is described and shown in further detail below (in connection with FIG. 4). After reaching the current limit, the high side switch of the switch circuit SW4 is turned OFF while allowing the inductor current to recirculate and ramp down through the low-side switch being turned ON, in one embodiment for a fixed off-time interval (which as described below may be programmable).

At the end of the off-time interval, the high side switch of SW4 is again turned ON which causes the transient phase inductor current to increase again. This pulsed or open loop, bang-bang control of the transient phase inductor current exhibits a generally saw tooth type of waveform as shown in FIG. 3. This behavior continues so long as the high slope is being detected on Vfb, but stops when the low slope is detected. The reduction in slope of Vfb is being mainly caused by the power boost from the transient phase and also as the current from rest of the steady state phases catch up. Now, when the low slope is detected, this causes the L4en signal to be de-asserted as shown (while tristate continues to remain de-asserted). The de-assertion of L4en causes the phase control output that is directly driving the switch circuit 4 (see FIG. 1) to be de-asserted so as to turn OFF the high side switch of switch circuit SW4, while allowing the inductor current in the transient phase to circulate downward towards zero through the low side switch being turned ON. Note however that if a diode is used, instead of turning ON the low side switch, it may automatically commutate the current to zero and hence no extra control of the low-side transistor is needed. Since the inductor current in the transient phase is ramping down, the output voltage slope again starts increasing since the current in the rest of the phase currents have yet to reach the load requirement. The inductor current reaches zero and may then stay at zero before the next high slope detection is detected which causes the phase control output to be asserted again, which turns ON the high side of SW4 thereby resulting in the inductor current ramping upward again, until the switch circuit SW4 is turned OFF due to either a current limit being reached or a predetermined on-time interval expiring. The pulsed or sawtooth type behavior of the inductor current continues once again until the low slope is detected in Vfb, resulting in SW4 being turned OFF and the inductor current being allowed to circulate towards zero through the low side switch being turned ON (or through a diode). Note here however that in this second instance where the transient phase inductor current crosses zero, the inductor currents of the steady state phases ramped upward considerably and are therefore contributing to the load, much more than at time marker 50. Therefore, the duration over which the transient phase inductor current is being pulsed (bang-bang interval) has become smaller.

Next, at time marker 50.7, the high slope is again detected (for the third time), which causes tristate to be de-asserted (it had been temporarily asserted when the transient phase current had reached zero and until the next high slope was detected). This also causes L4en to be asserted, resulting in the transient phase inductor current ramping upward for the third time (from zero). The inductor current reaches its upper level (again either due to a current limit blocker being activated or due to an on-time interval expiring) and L4en being earlier de-asserted due to slower slope detection, turns OFF the high side of SW4 and allows the inductor current to ramp down to zero through the low-side switch/diode. After this point, since there are no further detections of the high slope, the phase control output is no longer pulsed and so the inductor current is allowed to continue to fall and reach zero, and then remains at zero because the slope in Vfb is not high enough (no further high slope is detected). The latter circumstance again causes tristate to be asserted, this time signifying that switch circuit SW4 is disabled since the inductor current is now also zero. It can also be seen that starting at about time marker 51 and beyond, the inductor currents of the steady state phases have reached a high enough level that enables dc regulation of the output voltage to be stable (by operation of the steady state mode portion 4).

FIG. 3 also shows how a transient load condition may be defined, as starting with the step load current at time marker 50, and ending when the transient phase inductor current has reached zero and the power supply output (or the feedback voltage from the power supply output) has returned to within a nominal specified voltage ripple, for instance at time marker 51.3. Thereafter the steady state load condition resumes, because the power supply output or the feedback voltage is within the nominal specified voltage ripple.

Figure 4:
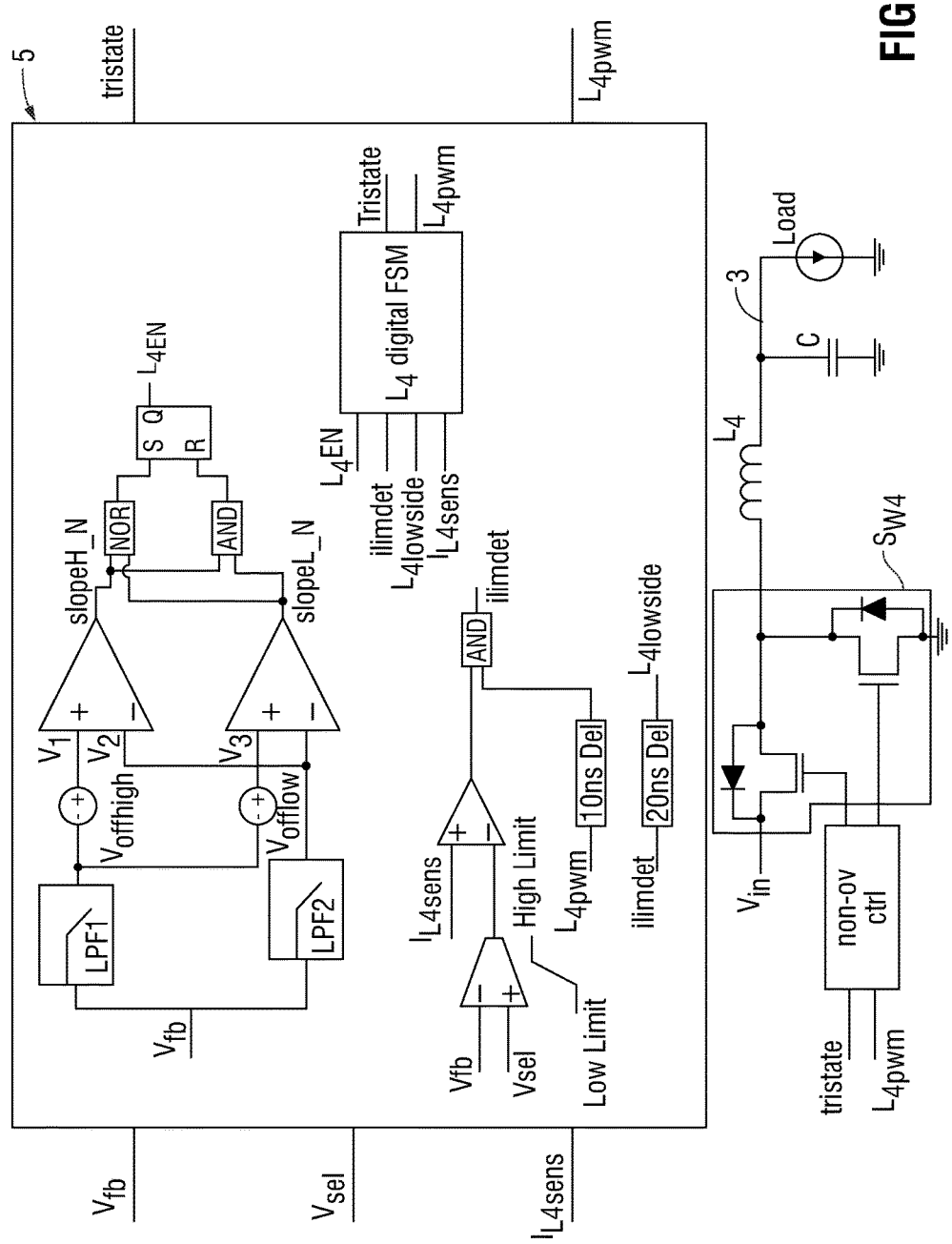
FIG. 4 is a combined block diagram and circuit schematic of a slew mode control circuit that uses a current limit blocker to control pulse width of the phase control output.
Figure 8:
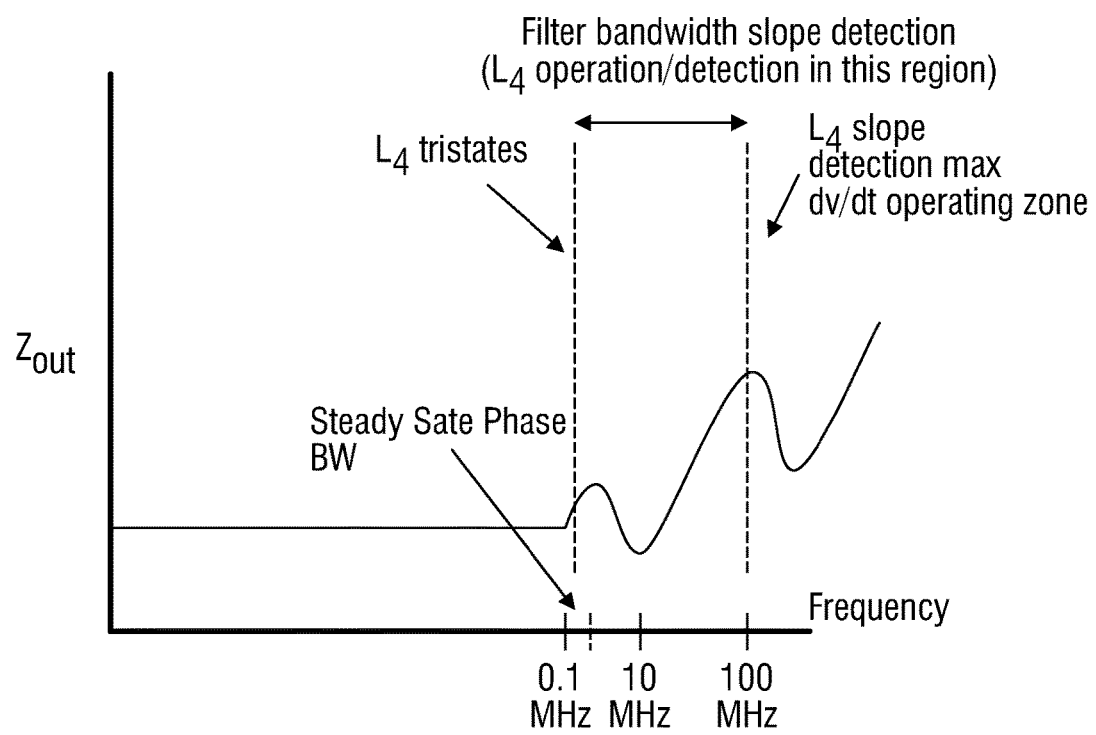
FIG. 8 is a graph of output impedance vs. frequency of an embodiment of the switch mode power supply circuit.

Another view of the high slope and low slope-based slew mode control circuit is to consider the behavior of the output impedance at the power supply output 3. Under this view, the switching operation of the transient phase may be triggered between the steady-state bandwidth of the other phases and up to the bandwidth of any power supply decoupling or filter capacitors (e.g., some of which may be on-chip as part of the load, e.g., a system on a chip, SoC). This allows any transient droop (or overshoot, if so configured) to be reduced, to the output impedance curve under large signal operation. Referring to FIG. 8, an example may be from 0.3 MHz to 100 MHz where the steady state bandwidth of the power supply circuit may be around 0.3 MHz while the filter capacitors may be designed to filter at up to 100 MHz using on-chip decoupling capacitors. The high and low slopes may also be programmed by considering the output impedance behavior in FIG. 8, where detection of the low slope may be near the bandwidth of the steady state phases, while the detection of the high slope is enabled by programming the cutoff frequency of LPF1 to be near the bandwidth of the on-chip (load-side decoupling capacitors), by proper programming of the LPF1 and LPF2 filters and Voffhigh and Vofflow offsets of the comparators. The entry and exit of the slew mode control of the transient phases may be based on high and low slope detection using low pass filters (LPFs), offsets and comparator logics as shown in FIG. 4 which is one example of its implementation. Other examples with different filter designs (with fewer or more filters), comparator logics and digital logic gates, may also be used to implement the slew mode control.

FIG. 4 is a combined block diagram and circuit schematic of a slew mode control circuit. This figure serves to illustrate several aspects of the slew mode control circuit (that is part of the transient mode portion 5), namely the addition of a non-overlapping control driver circuit at the two phase control outputs (tristate and L4pwm), and a current limit blocker which is one implementation of a bang-bang control of the transient phase inductor current during the time interval between the detection of a high slope and a subsequent detection of a low slope. As pointed out above however, not all elements or components shown in a figure are necessary or needed for a given embodiment. For example, the further phase control output, tristate, may not be needed in instances where the switch circuit SW4 does not have an operating low side transistor (and instead relies on only a diode connected to ground, to provide a one way recirculation path to ground). Also in that embodiment, the non-overlap control driver circuit itself may not be needed, since there is only the high side switch that needs to be controlled, whereas in the case of both a high side and a low side transistor being used as shown, shoot through is a concern which is mitigated by the driver circuit ensuring that the timing between the control signals at the gates of the high side and low side transistors, respectively, do not overlap so as to result in a shoot through situation.

The transient mode portion 5 depicted in FIG. 4 has a slew mode control circuit that is implemented in analog form, as follows. There is a first or upper analog comparator whose output is a first bistable comparison indication, slope H_N (where N indicates active low), between a first low pass filtered and offset version of the feedback voltage (V1) at a +ve input, and a second low pass filtered version of the feedback voltage (V2) at a –ve input. There is also a second (lower) analog comparator whose output is a second bistable comparison indication, slope L_N (active low), between V2 at its +ve input and a third offset version of the feedback voltage (V3) at its –ve input. There is also logic circuitry that produces the phase control output, L4pwm, to be a function of the first and second comparison indications, slope H_N and slope L_N, where such logic circuitry includes the NOR gate, the AND gate, the SR latch, and the finite state machine (FSM). An example of the FSM is given in FIG. 7.

Figure 5:
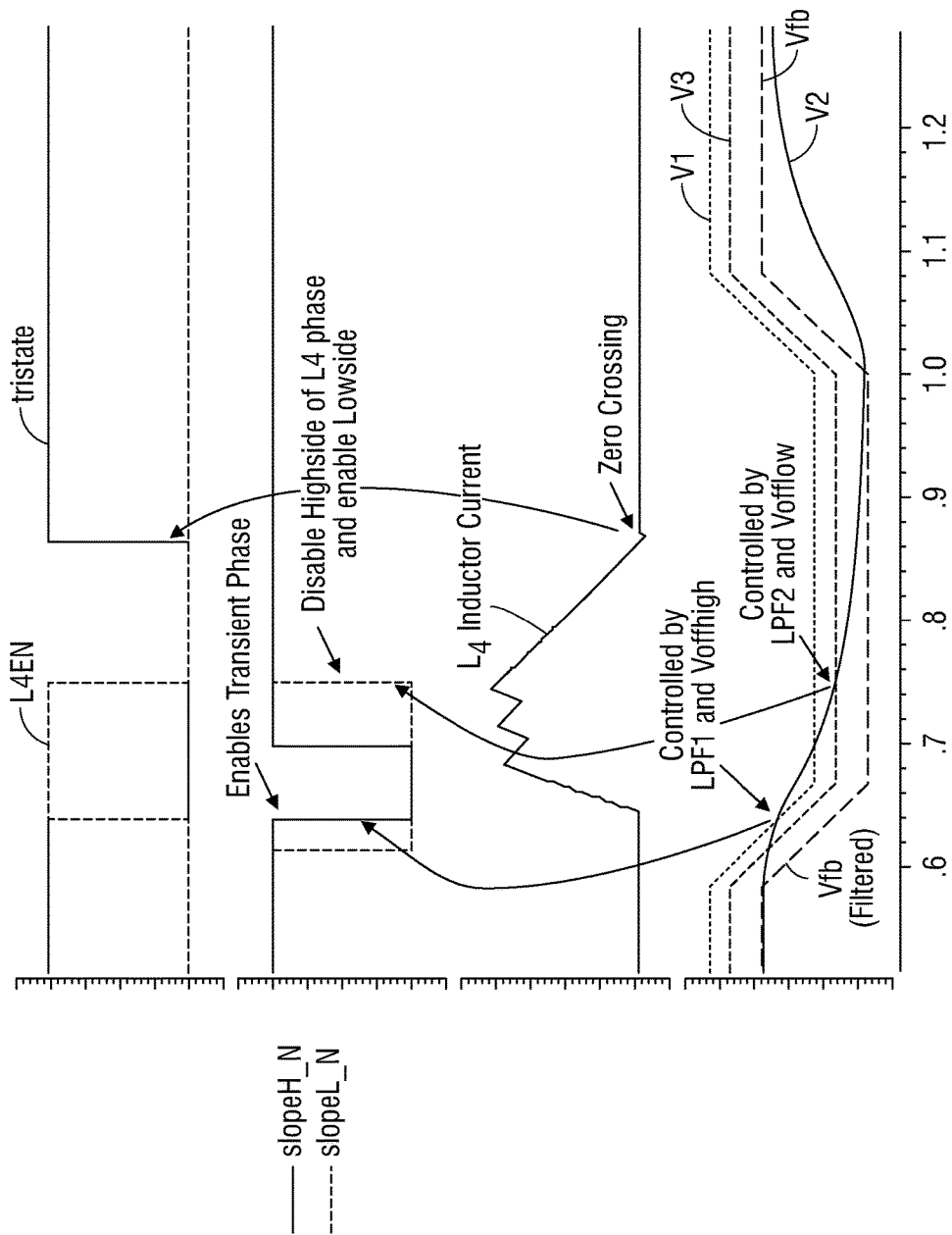
FIG. 5 is a graph of waveforms obtained from a simulation of the slew mode control circuit of FIG. 4.
Figure 7:
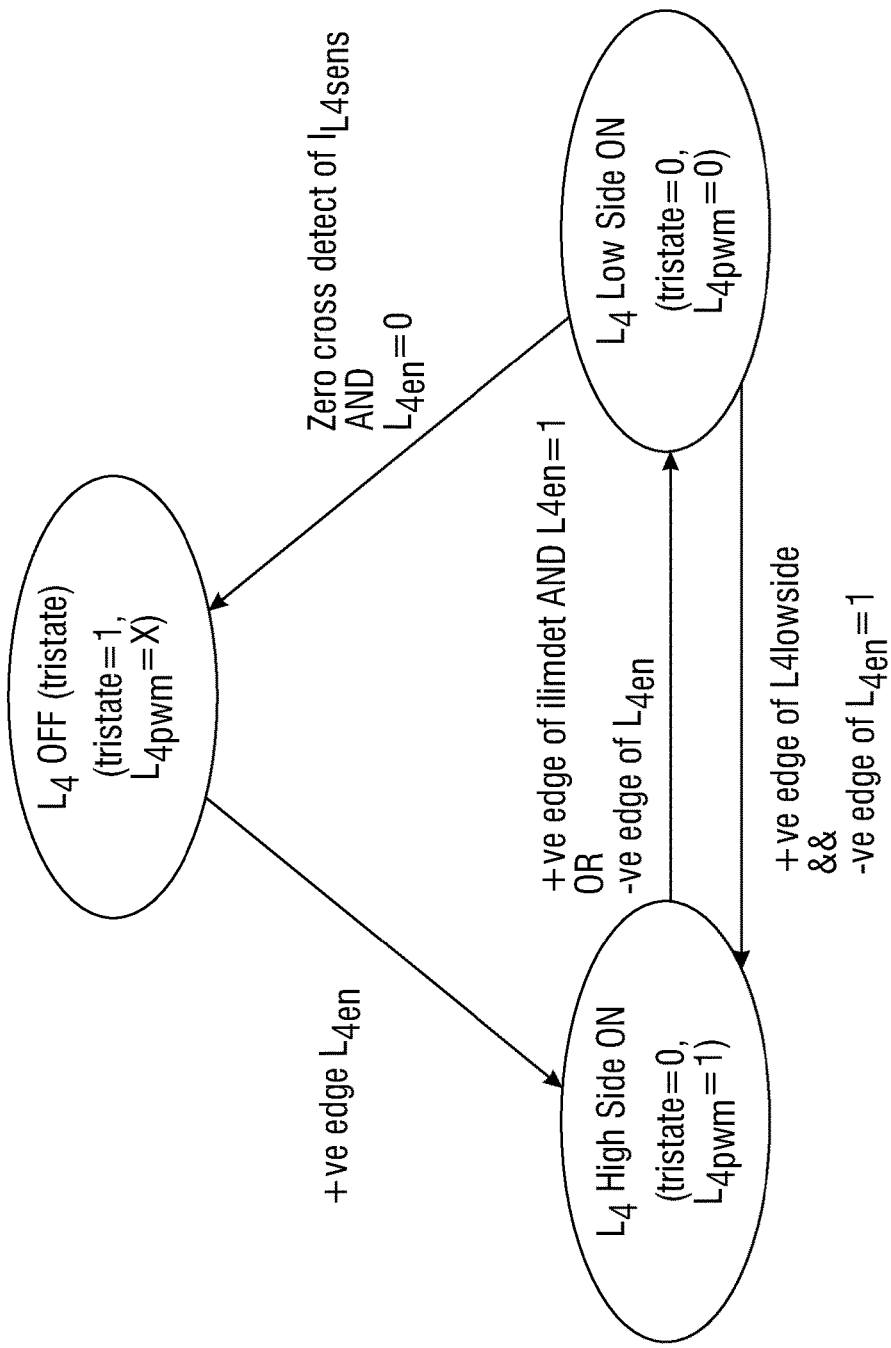
FIG. 7 illustrates an example of a finite state machine used to generate the tri-state and pulsed output signals of the slew mode control circuit.

Detailed operation of the circuit in FIG. 4 may be described as follows, while also referring to the waveforms and timing illustrated in FIG. 5. When the output voltage (voltage of the power supply output 3) is at steady state as reflected in the feedback voltage Vfb, namely before time marker 0.6, Vfb and V2 are at the same voltage while V1 which is at the +ve input of the upper comparator is parked at a predetermined offset, Voffhigh, in this example 5 millivolts above the –ve input of the upper comparator. As a result, the output of the upper comparator, slope H_N (active low), is initially high. Similarly, the initial state of the lower comparator is also initially high since its +ve input is higher, by the predetermined offset Vofflow (e.g. 3 millivolts), than its –ve input. When a load transient occurs (in FIG. 5, at time marker 0.5), Vfb (a filtered version of which is shown) begins to fall. Also, V2 begins to fall but since it is a low pass filtered version (as defined by the transfer function of LPF2) it falls more slowly than Vfb. In addition, V2 also falls more slowly than V1 and V2, due to the lower cut off frequency of LPF2 relative to that of LPF1, where the latter governs the fall rate of both V1 and V3. As a result, when V3 crosses below V2 and then when V1 crosses below V2, the SR latch is set (L4*en* goes high) which may be described as the transient phase being enabled. The latter means that the transient phase is now operating in bang-bang control, based on either current limiting or fixed on/off time control, which takes place, as seen in FIG. 5, between time marker 0.64 and time marker 0.76. At time marker 0.74, the slope of Vfb is sensed when V2 has continued its decrease and crosses under both V1 and V3, where this condition causes both the upper and lower comparators, that is their outputs, to go high, so that the SR latch is now reset or cleared (L4*en* goes low). As seen in FIG. 7, this causes the FSM to change state at the negative edge of L4*en*, which transitions SW4 from its high side transistor being turned ON to the high side transistor being turned OFF and the low side transistor being turned ON (achieved using in this case both phase control outputs, tristate and L4*pwm*). As explained above, if the switch circuit SW4 is of asynchronous design, meaning that only a diode connected to ground instead of a low side transistor, then the L4 inductor current will recirculate towards zero automatically when the high side is turned OFF (so that the additional phase control output, tristate, may not be needed in that case).

As has been described above, FIG. 4 shows an example slew mode control circuit that uses a current limit-based blocker circuit that is configured to govern pulse width at the phase control output L4*pwm*, in a bang-bang control scheme. This is based on i) a programmable value that represents a desired limit on the transient phase inductor current, and ii) another programmable value, e.g., Vsel, that represents a threshold for generating an "output error" or difference between the feedback voltage Vfb and Vsel. The pulse width is governed ultimately by the FSM (see FIG. 7), and this is governed on a per cycle or repeating basis based on a circuit (not shown) that is sensing the transient phase inductor current (IL4*sens*). This sensed current is compared to an inductor current limit or threshold, here at the −ve input of a comparator whose +ve input receives the sense inductor current, IL4*sens*. The threshold at the negative input may be defined by a Gm-controlled value, i.e., a value that is based on the output voltage error relative to a set threshold, Vsel, and gained by an amplifier circuit, but is limited to be between a low limit and a high limit (both of which may be programmable). The inductor current limit is automatically generated to be between the high limit and the low limit depending on the output error, and closer to the high limit when the error is large (e.g., Vfb has drooped too much below Vsel), and closer to the low limit when the error is small. This is also referred to here as a Gm-clamp. In other words, the limit on the transient phase inductor current that is reached during the time interval, referring now to FIG. 5, between time marker 0.64 and 0.76 is decided by the change or error in the voltage of the power supply output 3 (as reflected in the feedback voltage Vfb). This mechanism helps prevent overshooting of the transient phase inductor current, as a function of the present load, which is indirectly related to the change or error in Vfb or the output voltage. Still referring to FIG. 5, the time interval or off-time that is forced following the limit being reached by the inductor current may be programmable, and in this example is set to 20 nanoseconds by a delay cell as shown in FIG. 4, where this may be set to allow enough time so as to prevent a runaway of the inductor current. This off-time may be programmable, based on a programmable look-up table that lists a number of different power supply input and power supply output voltage conditions and their respective off-times.

The pulse width of the phase control output L4*pwm* may alternatively be governed without having to sense the inductor current of the transient phase. This embodiment of the slew mode control circuit is depicted by an example in FIG. 6, which uses what is referred to here as an on-time blocker circuit. The on-time blocker automatically sets the pulse width of L4*pwm* to a controllable value (representing a time interval), between an upper limit (long) and a lower limit (short), as a function of the present output error, and using an output voltage error-based Gm-controlled circuit that sets a delay cell to have the upper and lower limits. The on-time blocker thus also features the Gm-clamp, which means that the on-time is automatically selected to be a long interval when the output voltage change is large (e.g., when Vfb has drooped too far below Vsel), and short when the output voltage error is small. The on-time interval in this case, referring to FIG. 5, is the time interval during which the inductor current is allowed to increase before it is automatically forced to changed direction, without having to sense the inductor current. This approach of not having to sense the inductor current is preferred, as opposed to the current limit blocker approach of FIG. 4, when the transient phase inductance is so small that the inductor current rises or falls too quickly for the reaction time of the current limit blocker circuitry that produces the control signal ilimdet (current limit detected). In particular, if the L4 inductor is an air-core inductor then saturation may not be important such that the current limit blocker approach described above may not be needed.

Figure 6:
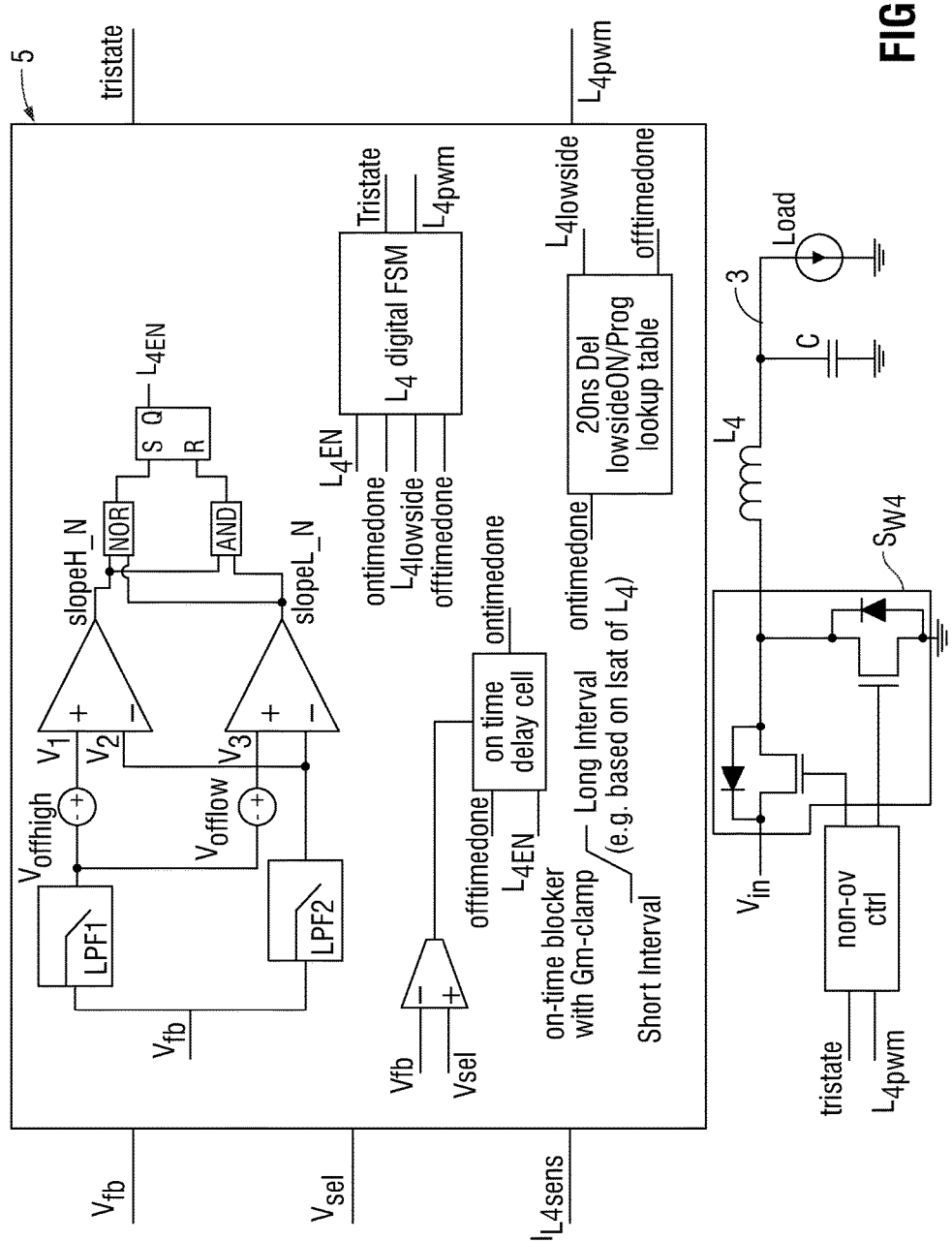
FIG. 6 is a circuit schematic illustrating a slew mode control circuit that uses an on-time blocker to set the pulse width of the phase control output.

Still referring to FIG. 6 and the on-time blocker, a programmable on-time delay cell may be provided that represents the on-time interval. A further programmable value may be provided that represents the off-time of the phase control output, for the on-time blocker embodiment of FIG. 6, where this off-time interval should be long enough to allow the inductor current to fall enough so that next time the transient phase is turned ON, there is a desired time interval over which the inductor current can then ramp back up to its upper level and not to allow run-away. The off-time may be programmable based on a look-up table that lists a number of different input voltage and output voltage states and the respective off-times to be selected for each.

The SMPS circuit 2 may have additional programmable features that enable it to operate a transient phase inductance that is variable, e.g., in the range of 1-10 nanoHenrys, or that enable it to be tuned for improved efficiency at a given transient phase inductance. In particular, one or more of the following features shown in FIG. 4 and FIG. 6 may be made programmable via externally accessible registers: delay cells, the LPF1 and LPF2, Voffhigh, Vofflow, Vsel, output voltage-controllable inductor limits, output voltage controllable on-time with lower and upper limits controlling short and long on-time intervals and programmable off-time.

In one embodiment, the multi-phase SMPS circuit 2 may be divided into just two portions, namely the state mode portion 4, which serves to provide primarily the steady state or slow varying portion of the current drawn by the load (from the power supply output 3), for example the maximum rated dc load current can be sourced by the steady state phases, and the transient mode portion 5 which is only enabled when the power supply output 3 is in a transient load condition (e.g., it is disabled when the power supply output 3 is in a steady state condition). Further, an output voltage based threshold called Vunder (for undershoot) and Vover (for overshoot) may be used in conjunction with the slope detection mechanism, to control the initial triggering of the transient phase switching.

Under certain oscillating load transient cases, where the load current goes from low to high and from high to low at a certain frequency window, e.g., between 10 MHz to 20 MHz, the transient phase may be pulling a certain fraction of DC load (some portion of the DC load current is being steered through the transient phase instead of the steady state phases.) Such usage of the transient phase may be undesirable. To mitigate such a situation, a watch dog timer may be set to count down a time interval that is commensurate with the control bandwidth of one or more of the steady state phases, e.g., between 1 microsecond to 2 microseconds. The watch dog timer is reset by a steady state phase ON control signal or pulse width modulation (PWM) control signal, that is controlling turn ON of one or more of the steady state phases. If the watch dog timer expires (because it was not timely reset by the control signal), then this forces the steady phases to turn ON and thereby ramp up their currents, up to a steady state current, e.g. a current that is set in accordance with a Gm-controlled value, such as described above. In addition, this expiration of the watch dog timer may force the transient phase to be turned OFF. This advantageously prevents the transient phase from having to bear a significant portion of the full load. Furthermore, the amount of DC load that is steered away into the transient phase may be shaped by design choices of the implementation parameters so that the transient phase inductor is optimized.

The following further statements of invention can be made.

A method for DC-DC power conversion that uses a multi-phase switch mode power supply circuit may include the following operations (some of which may partially overlap another in time). During a steady state load condition on a power supply output, one or more switch circuits that transfer power to the power supply output through one or more other phase inductors, respectively, that are a subset of a plurality of phase inductors, are controlled so as to regulate voltage at the power supply output. The steady state load condition may be defined as when the power supply output is within a nominal specified voltage ripple. During a transient load condition on the power supply output, one or more switch circuits are controlled to transfer power to the power supply output through one or more transient phase inductors, respectively, that are a different subset of the plurality of phase inductors. The one or more switch circuits are controlled so that the one or more transient phase inductors do not transfer power to the power supply output during the steady state load condition. The transient load condition may be defined as starting with a step load current on the power supply output, and ending when the inductor current has reached zero during ii) below, and the power supply output has returned to within a nominal specified voltage ripple. During the transient load condition,
 i) the switch circuit for the transient phase inductor is pulsed so as to increase the inductor current, when slope of the power supply becomes high, and then
 ii) the switch circuit is turned OFF such that the inductor current decreases to zero, when the slope of the power supply output becomes low, and
 iii) i) and ii) are repeated, whenever the slope of the power supply output becomes high and the inductor current reaches zero in ii).

In another embodiment, the switching of the transient phase is triggered at a rate that is between steady-state bandwidth of the other phases and up to the bandwidth of a load-side, on-chip passive which may include a capacitor. This may result in reduction of transient droop or overshoot in accordance with an output impedance curve under large signal operation, an example of which may be from 0.3 MHz to 100 MHz where the steady state bandwidth of the power supply circuit may be around 0.3 MHz and the filter capacitors on the power supply output may be designed to attenuate above 100 MHz using load-side on-chip passives (e.g., capacitors).

In accordance with yet another embodiment, a slew mode control circuit detects a high slope and then a low slope in a feedback voltage, which may be the power supply output voltage itself or a version derived therefrom. This detection may also be referred to here as bandpass slope detection. Such detection is implemented digitally by quantizing the feedback voltage and an output voltage error, and detecting the slopes directly in the quantized feedback voltage.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, while FIG. 4 and FIG. 6 depict analog solutions to various aspects of the slew mode control circuit, including the detection of the high and low slopes by the upper and lower analog comparators, an all digital implementation is also possible by sampling and converting into digital form the feedback voltage Vfb, and then performing the low pass filtering, offset, and comparison functions in the digital domain. The description is thus to be regarded as illustrative instead of limiting.

What is claimed is:

1. A multi-phase switch mode power supply circuit for controlling transfer of power to a power supply output through a plurality of phase inductors, and for regulating voltage at the power supply output, the circuit comprising:
 a switch mode power supply (SMPS) controller portion having one or more phase control outputs that are to be coupled to one or more control inputs of one or more switch circuits, respectively, that conduct inductor current through one or more other phase inductors, from amongst the plurality of phase inductors, wherein the controller is configured to pulse the phase control outputs so as to regulate voltage at the power supply output responsive to a feedback voltage from the power supply output; and
 a transient mode portion having
  a phase control output to be coupled to one or more control inputs of one or more switch circuits that conduct inductor current through one or more transient phase inductors, from amongst the plurality of phase inductors, and
  a slew mode control circuit configured to detect a high slope and then a low slope in the feedback voltage and, only in between detection of the high slope and the low slope, pulse the phase control output of the transient mode portion so that a switch circuit that conducts transient phase inductor current adds power to, or sinks power from, the power supply output.

2. The power supply circuit of claim 1 wherein the slew mode control circuit is configured to:
 cause the phase control output of the transient mode portion to be i) asserted to turn on the switch circuit that conducts transient phase inductor current, in response to both the high slope being detected and detecting that absolute value or level of the feedback voltage is below a predetermined threshold, and ii) de-asserted to turn off the switch circuit in response to the low slope being detected.

3. The power supply circuit of claim 2 wherein each of the one or more transient phase inductors has smaller inductance than every one of the other phase inductors.

4. The power supply circuit of claim 1 wherein the slew mode control circuit further comprises:
   a further phase control output; and
   a non-overlapping control driver circuit having:
      a first input coupled to the phase control output,
      a second input coupled to the further phase control output, and
      first and second outputs to be coupled to control a high side transistor and a low side transistor, respectively, of the switch circuit.

5. The power supply circuit of claim 4 wherein the transient mode portion is to control droop in the power supply output voltage, by being configured to:
   a) assert the phase control output so as to turn on the high side transistor and turn off the low side transistor through the driver circuit, to increase the inductor current, in response to detecting the high slope in the feedback voltage, and then
   b) de-assert the phase control output so as to turn off the high side transistor and turn on the low side transistor through the driver circuit, to decrease the inductor current towards zero, in response to detecting the low slope in the feedback voltage, and then
   c) assert the further phase control output to turn off both the low side transistor and the high side transistor in response to i) the inductor current through the transient phase inductor reaching zero, and ii) the feedback voltage having reached the low slope or its slope having changed polarity.

6. The power supply circuit of any claim 1 wherein the transient mode portion comprises:
   a current limit-based blocker circuit that is configured to govern pulse width at the phase control output, based on an output voltage error-based controllable value that represents a variable limit on inductor current through said one or more transient phase inductors that is clamped to a lower limit and an upper limit, and that has a programmable value which represents a programmable threshold for the feedback voltage.

7. The power supply circuit of claim 6 wherein the transient mode portion comprises a further programmable value that represents off-time of the phase control output.

8. The power supply circuit of claim 1, wherein the transient mode portion comprises:
   an on-time-based blocker circuit that is configured to set pulse width of the phase control output based on an output voltage error based controllable value that represents a time interval that is clamped between a short limit and a long limit, and that uses a programmable value that represents a programmable threshold for the feedback voltage.

9. The power supply circuit of claim 8 wherein the transient mode portion comprises a further programmable value that represents off-time of the phase control output.

10. The power supply circuit of claim 1 wherein each of the one or more transient phase inductors has at least ten times smaller inductance than every one of the other phase inductors.

11. The power supply circuit of claim 1 wherein each of the one or more transient phase inductors has at least one hundred times smaller inductance than the other phase inductor that has largest inductance.

12. The power supply circuit of claim 1 further comprising:
   a programmable circuit configured to store first and second parameters that define the high and low slopes, respectively; and
   a digital communication interface to the programmable circuit, through which the first and second parameters can be written by a device external to the power supply circuit.

13. The power supply circuit of claim 1 wherein the slew mode control circuit comprises:
   a first analog comparator whose output is a first bistable comparison indication between a first low pass filtered and offset version of the feedback voltage and a second low pass filtered version of the feedback voltage;
   a second analog comparator whose output is a second bistable comparison indication between the second low pass filtered version of the feedback voltage and a third offset version of the feedback voltage; and
   logic circuitry that causes the phase control output to be a function of the first and second bistable comparison indications.

14. The power supply circuit of claim 13 wherein the first low pass filtered and offset version is produced using a first low pass filter, and wherein the second low pass filtered version is produced using a second low pass filter that has a lower cutoff frequency than the first low pass filter.

15. The power supply circuit of claim 14 wherein the first and second low pass filters have variable cutoff frequencies that are set as per first and second parameters that are stored in a programmable circuit.

16. The power supply circuit of claim 1 further comprising:
   a programmable circuit configured to store a transient mode value or a steady state mode value; and
   a digital communication interface to the programmable circuit, through which the transient and steady state mode values can be written by a device external to the power supply circuit,
   wherein the transient mode portion is automatically self-configured in accordance with the programmable circuit, into:
      i) the phase control output remaining part of the transient mode portion and being enabled only during transient load conditions, when the transient mode value has been written, and
      ii) the phase control output being re-configured to be part of a steady state control loop and being enabled during both transient load conditions and steady state conditions, when the steady state mode value has been written.

17. The power supply circuit of claim 1 wherein the switch circuits that conduct the inductor currents through the one or more other phase inductors and the one or more transient phase inductors comprise a plurality of switching transistors that conduct the inductor currents and are to receive the same power supply input voltage.

18. The power supply circuit of claim 1 wherein the switch circuits that conduct the inductor currents through the one or more other phase inductors and the one or more transient phase inductors comprise a plurality of switching transistors that conduct the inductor currents and are rated to operate at 5 Volts.

19. The power supply circuit of claim 1 wherein the switch circuits that conduct the inductor currents through the one or more other phase inductors and the one or more transient phase inductors comprise a plurality of switching transistors that are formed on the same integrated circuit die as the SMPS controller portion and the transient mode portion.

20. The power supply circuit of claim 1, in combination with the plurality of phase inductors, which include the one or more transient phase inductors and the one or more other phase inductors, wherein at least one of the one or more other phase inductors is a discrete, multi-loop inductor and at least one of the one or more transient phase inductors is a partial loop of wire that is located close to the discrete, multi-loop inductor so as to be magnetically coupled therewith.

21. A method for DC-DC power conversion that uses a multi-phase switch mode power supply circuit, comprising:
during a steady state load condition on a power supply output, controlling one or more switch circuits that transfer power to the power supply output through one or more other phase inductors, respectively, that are a subset of a plurality of phase inductors, and to regulate voltage at the power supply output; and
during a transient load condition on the power supply output, controlling one or more switch circuits to transfer power to the power supply output through one or more transient phase inductors, respectively, that are a different subset of the plurality of phase inductors, wherein the one or more switch circuits are controlled so that the one or more transient phase inductors do not transfer power to the power supply output during the steady state load condition,
and wherein, during the transient load condition:
i) the switch circuit for the transient phase inductor is pulsed so as to increase the transient phase inductor current when slope of the power supply becomes high, and then
ii) the switch circuit for the transient phase inductor is turned off such that the transient phase inductor current decreases to zero when the slope of the power supply output becomes low, and
iii) i) and ii) are repeated whenever the slope of the power supply output becomes high and the inductor current reaches zero in ii).

22. The method of claim 21 wherein each of the one or more transient phase inductors has smaller inductance than every one of the other phase inductors.

23. The method of claim 21 wherein the transient load condition is voltage droop, and wherein a high slope is more negative, or more inclined downward versus time, than a low slope.

24. The method of claim 21 wherein the low slope can be negative or inclined downward versus time, or it can be positive or inclined upward versus time.

25. The method of claim 21 wherein the transient load condition is voltage overshoot, and wherein a high slope is more positive, or more inclined upward versus time, than a low slope.

26. The method of claim 25 wherein the low slope can be positive or inclined upward versus time, or it can be negative or inclined downward versus time.

27. The method of claim 21 further comprising:
resetting a watch dog timer in accordance with a control signal that is controlling turn on of a switch circuit for a phase other than the transient phases; and
in response to the watch dog timer expiring, forcing the switch circuit for the phase other than the transient phases to turn on and forcing the switch circuits for the transient phases to turn off.

* * * * *